(12) United States Patent
Matsuda et al.

(10) Patent No.: US 8,258,058 B2
(45) Date of Patent: Sep. 4, 2012

(54) METHODS OF FORMING METAL PATTERNS IN OPENINGS IN SEMICONDUCTOR DEVICES

(75) Inventors: Tsukasa Matsuda, Seongnam-si (KR); Gilheyun Choi, Seoul (KR); Jongmyeong Lee, Seongnam-si (KR)

(73) Assignee: Samsung Electronic Co., Ltd. (KR)

( * ) Notice: Subject to any disclaimer, the term of this patent is extended or adjusted under 35 U.S.C. 154(b) by 0 days.

(21) Appl. No.: 13/411,873

(22) Filed: Mar. 5, 2012

(65) Prior Publication Data
US 2012/0164826 A1    Jun. 28, 2012

Related U.S. Application Data

(63) Continuation of application No. 12/714,571, filed on Mar. 1, 2010, now Pat. No. 8,148,261.

(30) Foreign Application Priority Data

Mar. 3, 2009  (KR) .......................... 10-2009-0018132

(51) Int. Cl.
*H01L 21/44*  (2006.01)

(52) U.S. Cl. ................................. 438/653; 257/E21.584
(58) Field of Classification Search ........................ None
See application file for complete search history.

(56) References Cited

U.S. PATENT DOCUMENTS

| 6,506,677 | B1 | 1/2003 | Avanzino et al. |
| 2004/0121586 | A1 | 6/2004 | Abell |
| 2004/0164293 | A1 | 8/2004 | Maloney et al. |
| 2005/0032352 | A1 | 2/2005 | Farrar |
| 2008/0311742 | A1 | 12/2008 | Watanabe et al. |

FOREIGN PATENT DOCUMENTS

| JP | 2005-277390 | 10/2005 |
| KR | 1020080047684 A | 5/2008 |

*Primary Examiner* — Seahvosh Nikmanesh
(74) *Attorney, Agent, or Firm* — Myers Bigel Sibley & Sajovec

(57) ABSTRACT

A method of forming a semiconductor device is disclosed. A dielectric layer having a opening therein is formed on a semiconductor substrate. An inner surface of the opening is treated by plasma. A barrier metal layer is formed on the plasma-treated inner surface of the opening. A seed layer is formed on the barrier metal layer. A metal bulk layer is formed on the seed layer. High quality semiconductor devices can be fabricated by using these methods, which may stably fill the opening formed in the dielectric layer.

5 Claims, 10 Drawing Sheets

METHODS OF FORMING METAL PATTERNS IN OPENINGS IN SEMICONDUCTOR DEVICES

CROSS-REFERENCE TO RELATED APPLICATION

This U.S. non-provisional application claims priority under 35 U.S.C. §120 as a continuation application of U.S. patent application Ser. No. 12/714,571, filed Mar. 1, 2010 now U.S. Pat. No. 8,148,261, which in turn claims priority under 35 U.S.C. §119 of Korean Patent Application No. 10-2009-0018132 filed on Mar. 3, 2009. The contents of both of the above-referenced applications are incorporated herein by reference in their entireties.

BACKGROUND

The present invention relates to semiconductor devices and, more particularly, to methods of forming metal patterns in openings in semiconductor devices.

A demand exists for semiconductor devices that have a high integration density, low power consumption and which are capable of high speed operation. To meet these requirements, various methods of forming patterns such as, for example, wiring patterns or contact plugs, have been proposed which form the patterns using a low resistivity metal. By employing low resistivity metal patterns, the operation speed of the semiconductor device can be improved and power consumption may be reduced. In addition, the use of low resistivity metal may permit the use of metal wiring patterns having reduced widths, which can facilitate increased device integration density.

Metal patterns can be formed by depositing a metal layer on a substrate or semiconductor layer and then patterning the deposited metal layer. The patterning may be performed by using a photolithography process to define a mask pattern and an etching process that etches the metal layer using the mask pattern as an etch mask. The metal patterns may alternatively be formed by a damascene method. For instance, a metal layer may be formed to fill an opening in an interlayer dielectric layer, and the metal layer may then be planarized to expose the dielectric layer. However, when the metal patterns are formed in a opening in an interlayer dielectric layer, various problems may arise that can degrade various characteristics of a semiconductor device. For example, a metal layer may not completely fill the opening in the interlayer dielectric layer, thereby forming a void. Even worse, a metal layer formed in a opening in an interlayer dielectric layer may not form an electrical connection with an underlying layer or structure. Such problems may degrade the performance of a semiconductor device or even cause a failure thereof. As the degree of device integration increases, the aspect ratio of the opening in the interlayer dielectric layer also tends to increase. Such higher aspect ratios may aggravate the aforementioned void and/or electrical, disconnection problems.

SUMMARY

The present invention may provide methods of forming highly integrated semiconductor devices and/or semiconductor devices that have dielectric layers which have openings therein that have metal patterns deposited therein. The present invention may also provide methods of forming semiconductor devices that can suppress the diffusion of metal atoms from metal patterns in a opening of an interlayer dielectric layer.

Example embodiments of the present invention provide methods of forming a semiconductor device. Pursuant to these methods, a dielectric layer having a opening therein is formed on a semiconductor substrate. An inner surface of the opening is treated by plasma. A barrier metal layer is formed on the plasma-treated inner surface of the opening. A seed layer is formed on the barrier metal layer. A metal bulk layer is formed on the seed layer.

In some embodiments, a conductive pattern may be formed on the semiconductor substrate prior to forming the dielectric layer. In such embodiments, the opening may expose a surface of the conductive pattern.

The plasma treatment may use at least one selected from a group of hydrogen, nitrogen, hydrogen and nitrogen, inert gas, and water vapor.

The barrier metal layer may include manganese (Mn) formed by chemical vapor deposition (CVD).

The inner surface of the concave portion may include an inner sidewall surface and a bottom surface, and the barrier metal layer may be continuously formed on the inner sidewall surface.

The seed layer may include copper (Cu) formed by CVD, atomic layer deposition (ALD), or electroless plating.

The metal bulk layer may include copper (Cu) formed by CVD, ALD, electro-plating, or electroless plating.

According to further embodiments of the present invention, the method may further include performing a heat-treatment process after forming the metal bulk layer. In such embodiments, the barrier metal layer may react with the interlayer dielectric layer by performing the heat-treating process.

The barrier metal layer, the seed layer and the metal bulk layer may be formed on the upper surface of the interlayer dielectric layer, and the methods may further include forming metal patterns in the opening by removing the portions of the seed layer and the metal bulk layer that are outside of the opening.

According to still further embodiments of the present invention, methods of forming semiconductor devices are provided in which a dielectric layer is formed on a semiconductor material. An opening is formed in the dielectric layer, the opening having a concave sidewall. The concave sidewall is then plasma-treated. A barrier metal layer is formed on the plasma-treated concave sidewall of the opening. A metal layer is then formed in the opening.

Further, example embodiments of the present inventive concept may provide methods of forming a high quality semiconductor device by suppressing the diffusion of metal atoms from a metal pattern in the concave portion of the semiconductor device.

BRIEF DESCRIPTION OF THE DRAWINGS

Example embodiments of the present invention will be more clearly understood from the following detailed description taken in conjunction with the accompanying drawings.

FIGS. 1 to 4 represent non-limiting, example embodiments as described herein.

FIG. 3 is a perspective sectional view of another opening having a modified shape.

FIG. 4 is a block diagram of a memory system employing a semiconductor device formed by exemplary embodiments of the present invention.

DETAILED DESCRIPTION

Figure 1A:
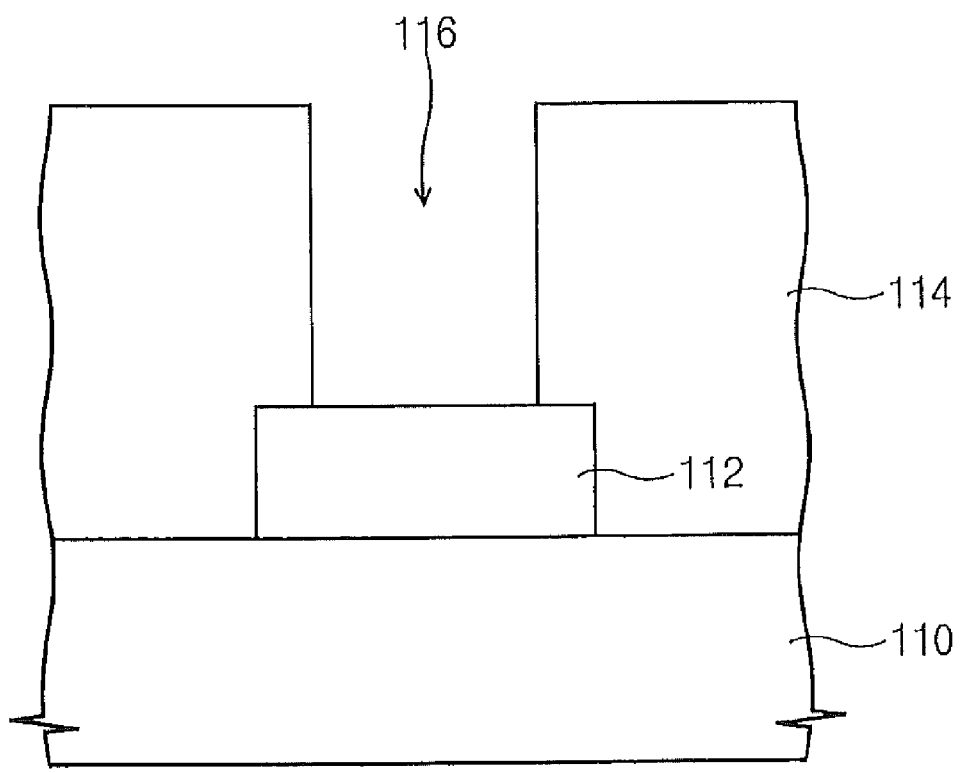
FIGS. 1A to 1G illustrate a method of forming a semiconductor device according to exemplary embodiments of the present invention.

Embodiments of the present invention now will be described more fully hereinafter with reference to the accompanying drawings, in which certain embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity. Like numbers refer to like elements throughout. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Additionally, relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. Accordingly, variations from the shapes of the illustrations as a result, for example, of manufacturing techniques and/or tolerances, are to be expected.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated steps, elements, and/or components, but do not preclude the presence or addition of one or more other steps, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

FIGS. 1A to 1G illustrate a method of forming a semiconductor device according to exemplary embodiments of the present invention.

Referring to FIG. 1A, an interlayer dielectric layer 114 is formed on a semiconductor substrate 110 that has a conductive pattern 112 thereon. The interlayer dielectric layer 114 may comprise a single layer or multiple layers. The semiconductor substrate 110 may comprise, for example, a single crystalline bulk silicon substrate or a p-type semiconductor substrate doped with p-type impurity like boron (B). In other embodiments, the semiconductor substrate 110 may comprise a silicon-on-insulator (SOI) substrate. In still other embodiments, the semiconductor substrate 110 may comprise a semiconductor layer such as, for example, a silicon layer that was epitaxially grown on a substrate. It will also be appreciated that the semiconductor substrate 110 may be formed of materials other than silicon such as, for example, germanium, silicon-germanium or any of a variety of wider band-gap semiconductor materials. The semiconductor substrate 110 may include, for example, a device isolation region and an active region that is defined by the device isolation region. Further, the semiconductor substrate 110 may include one or more wiring patterns and a plurality of semiconductor devices that are formed on the device isolation region and/or the active region.

The interlayer dielectric layer 114 may include insulating materials such as, for example, silicon oxide ($SiO_2$), undoped silicate glass (USG) and/or boron-phosphorous doped silicate glass (BPSG). An opening 116 which may have a concave shape may be formed in the interlayer dielectric layer 114. The opening 116 may expose a predetermined surface of the underlying conductive pattern 112. The underlying conductive pattern 112 may be, for example, a source/drain region, a gate electrode, or an underlying wiring pattern. In some embodiments, the underlying conductive pattern 112 may be omitted, and the opening 116 may expose a top surface of the semiconductor substrate 110. The opening 116 may have, for example, a circular cross-section so that the opening 116 has a cylindrical shape and penetrates the interlayer dielectric layer 114 to expose the underlying conductive pattern 112. In other embodiments, the opening 116 may comprise a groove that extends in a direction that is parallel to an upper surface of the semiconductor substrate 110. It will also be appreciated that the term "concave," as used herein, does not require a constant radii, but instead is used to encompass generally concave shapes that curve inwardly.

Figure 1B:
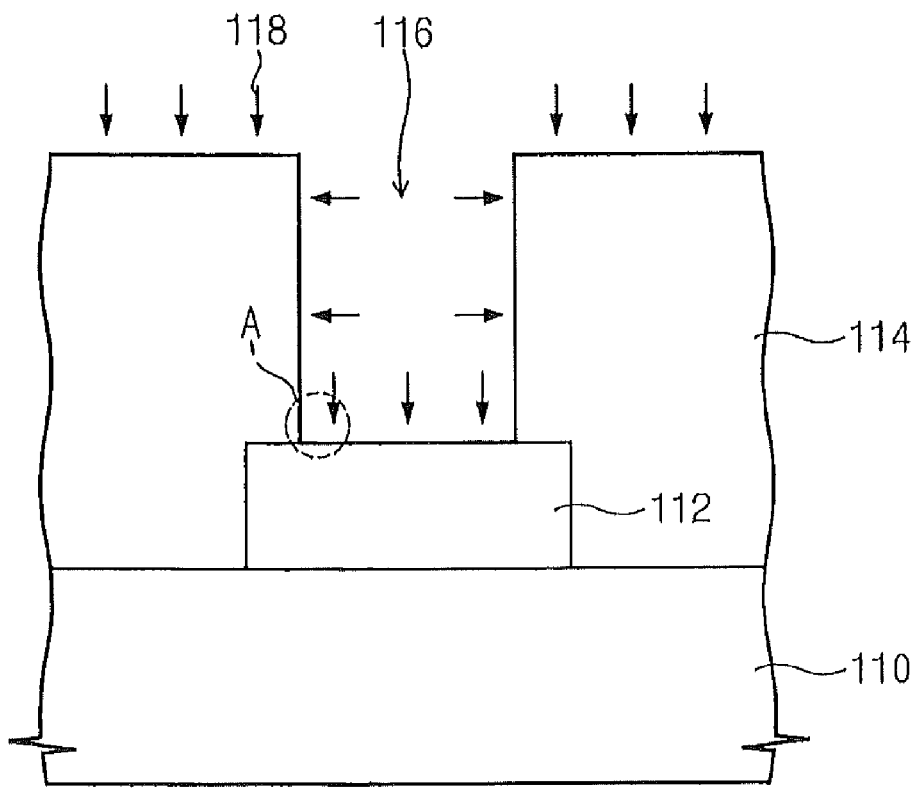

Referring to FIG. 1B, a plasma treatment 118 may be carried out on the semiconductor substrate 110, the conductive pattern 112 and the interlayer dielectric layer 114. As shown in FIG. 1B, the inner surface of the opening 116 may be subjected to this plasma treatment 118, as may the upper surface of the interlayer dielectric layer 114. The plasma treatment 118 may use at least one among hydrogen, nitrogen, hydrogen and nitrogen, an inert gas, and water vapor. Additional or other materials may also be used in the plasma treatment. The inner surface of the opening 116 may include an inner sidewall surface and a bottom surface. In some embodiments, the plasma treatment 118 may be carried out isotropically. In such embodiments, the inner surface of the opening 116 may be uniformly subject to the plasma treatment 118. The inner surface of the opening 116 may be converted into various shapes by the plasma treatment 118, as will be explained below with reference to FIGS. 2A and 2B.

Figure 2A:
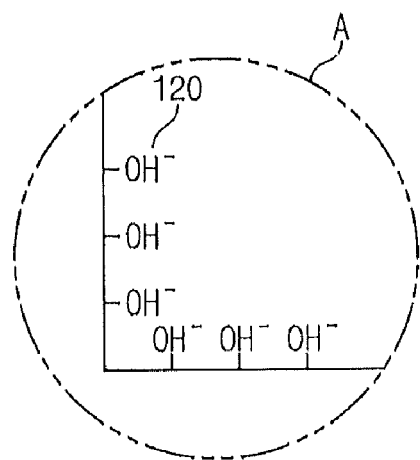
FIGS. 2A to 2B are enlarged views of a portion A of FIG. 1B.

FIG. 2A is an enlarged view of a portion A of FIG. 1B, which illustrates one exemplary embodiment of the inner surface of the opening 116 that is subjected to the plasma treatment 118.

Referring to FIGS. 1B and 2A, when the plasma treatment 118 is carried out in a process gas containing a gas mixture having hydrogen therein, OH radicals 120 may be formed on the inner surface of the opening 116. For example, where the plasma treatment 118 is carried out in a process gas that contains water vapor, $OH^-$ radicals 120 generated from the water vapor may be formed on the inner surface of the opening 116. These $OH^-$ radicals 120 may be formed by the reaction between the hydrogen contained in the water vapor and oxygen that is present at a surface of the interlayer dielectric layer 114. As another example, in the case that the plasma treatment 118 is carried out in a process gas containing hydrogen gas, OH⁻ radicals 120 may be formed on the inner surface of the opening 116 by the reaction between the hydrogen gas and the oxygen present at a surface of the interlayer dielectric layer 114. The OH⁻ radicals 120 may be uniformly formed on the inner surface of the opening 116, specifically including the inner sidewall surfaces of the opening 116.

Figure 2B:
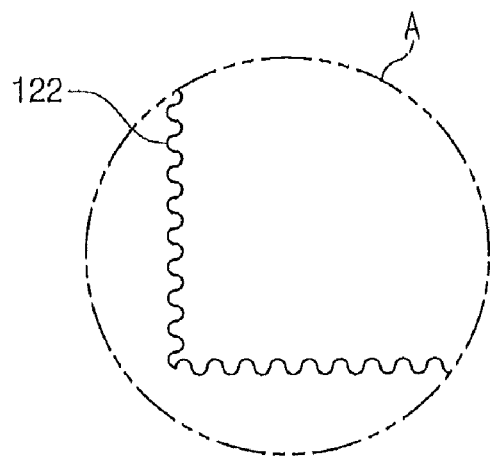

FIG. 2B is an enlarged view of portion A of FIG. 1B, which illustrates the shape of the inner surface of the opening 116 following a plasma treatment 118 according to embodiments of the present invention.

Referring to FIGS. 1B and 2B, a concave-convex profile 122 may be formed on the inner surface of the opening 116 due to the plasma treatment 118. In particular, high-energy plasma particles, which may be employed in the plasma treatment 118, may physically collide with the inner surface of the opening 116. Portions of the inner surface of the opening 116 that the high-energy plasma particles collide into may have a comparatively concave shape, while portions of the inner wall of the opening 116 that the high-energy plasma particles do not impact may have a comparatively convex shape. In this manner, the high-energy plasma treatment 118 may form the concave-convex profile 122 on the inner surface of the opening 116 shown in FIG. 2B. In some embodiments, the concave-convex profile 122 may be formed uniformly over the entire inner surface of the opening 116, specifically including the inner sidewall surface. When the plasma treatment 118 is carried out in a process gas containing an inert gas, the inner surface of the opening 116 may have the concave-convex profile 122.

According to another exemplary embodiment of the invention, the inner surface of the opening 116 may have both the concave-convex profile 122 and OH⁻ radicals 120 on the inner surface of the opening 116. This may be obtained, for example, using a process gas for the plasma treatment 118 that comprises a hydrogen gas and an inert gas.

Organic residues that may remain in the inner surface of the opening 116 may be removed by the plasma treatment 118.

Figure 1C:
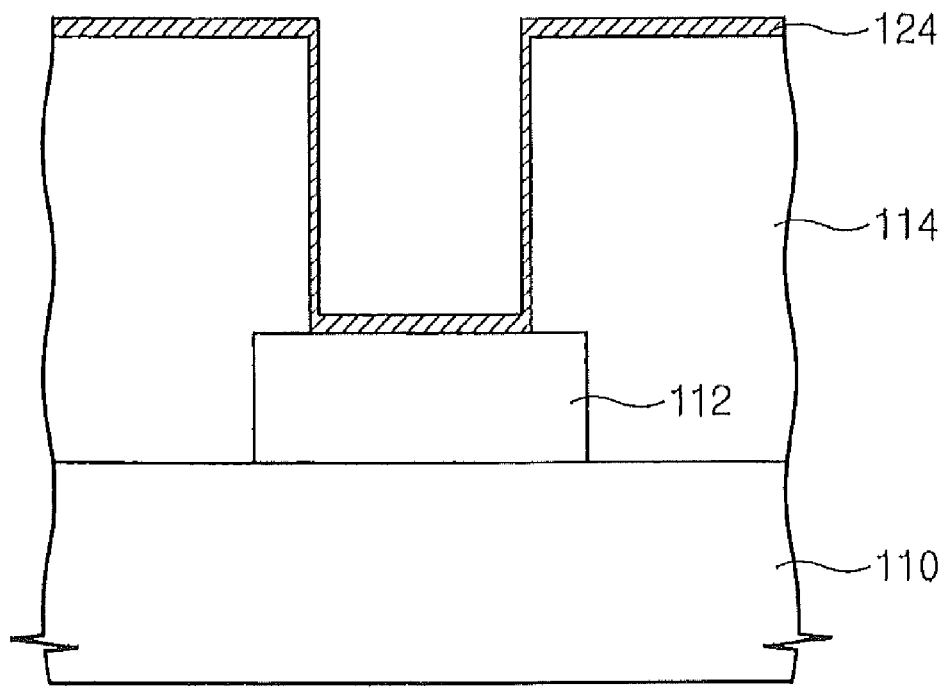

Referring to FIG. 1C, a barrier metal layer 124 may be formed on the plasma-treated inner surface of the opening 116. The barrier metal layer 124 may be continuously formed on the inner sidewall surface of the opening 116 and on the bottom surface of the opening 116. So, the inner sidewall surface of the opening 116 may be totally covered with the barrier metal layer 124. As shown in FIG. 1C, the barrier metal layer 124 may also be formed on an upper surface of the interlayer dielectric layer 114. In some embodiments, the thickness of the barrier metal layer 124 formed on the bottom surface of the opening 116 may be less than or equal to 10 nm. In some embodiments, the thickness of the barrier metal layer 124 formed on the inner sidewall surface of the opening 116 may be less than or equal to 1 nm. The barrier metal layer 124 may comprise, for example, manganese. The barrier metal layer 124 may be formed, for example, by a chemical vapor deposition (CVD) process. As a precursor for manganese deposition, (MeCP)2Mn(CO)₃ and/or (EtCP)2Mn may be employed. For example, manganese may be deposited using (MeCP)2Mn(CO)₃ and/or (EtCP)2Mn at a temperature of 100-500° C., at a pressure equal to or less than 500 mT, and at a flow rate of 10~500 sccm. It will be appreciated that the term "a layer continuously formed," as used herein, does not have space or hole the layer, for example, when the layer is continuously formed on the structure, the structure is totally covered with the layer, so the structure does not exposed.

As illustrated in FIG. 2A, when OH⁻ radicals 120 are formed on the inner surface of the opening 116, the nucleus of the barrier metal layer 124 may be formed by the reaction between the OH⁻ radicals 120 and a precursor for the barrier metal layer 124. By uniformly forming the OH⁻ radicals 120 on the inner surface of the opening 116, the number of nucleation sites for the barrier metal layer 124 may be increased. These nucleation sites may be formed uniformly on the inner surface of the opening 116. As a result, the barrier metal layer 124 may be continuously formed on the inner surface of the opening 116, specifically including the inner sidewall surface. For example, in the case that manganese is employed for the barrier metal layer 124, (MeCP)2Mn(CO)₃ and/or (EtCP)2Mn may be employed as the precursor. By the reaction between the OH⁻ radicals and (MeCP)2Mn(CO)₃ and/or (EtCP)2Mn, nucleation sites may be increased during the manganese forming process. The manganese may be continuously formed on the inner surface of the opening 116 by the increased nucleation sites.

As illustrated in FIG. 2B, when the inner surface of the opening 116 has the concave-convex profile 122, electron density can be increased in each convex shaped area. The convex shaped area having high electron density and a precursor employed to form a barrier metal layer 124 may react with each other, thereby increasing nucleation sites during the barrier metal layer 124 forming process. The barrier metal layer 124 may be continuously formed on the inner surface of the opening 116 by the increased number of nucleation sites. For example, in the case that manganese is used as a barrier metal layer 124, (MeCP)2Mn(CO)₃ and/or (EtCP)2Mn may be employed as the precursor. By the reaction between the convex shaped areas of the concave-convex profile 122, which has an increased electron density, and (MeCP)2Mn(CO)₃ and/or (EtCP)2Mn, nucleation sites may be increased during the manganese forming process. The manganese may be continuously formed on the inner surface of the opening 116 by the increased number of nucleation sites.

Organic residues that may remain in the inner surface of the opening 116 may be an obstacle to the formation of the barrier metal 124. Such organic residues may be removed by the plasma treatment 118, thereby increasing the nucleation sites available during the barrier metal layer 124 formation process. The increased number of nucleation sites may allow the barrier metal layer 124 to be continuously formed on the inner surface of the opening 116.

As explained in detail in the foregoing, when the barrier metal layer 124 is formed on the inner surface of the opening 116 after the plasma treatment 118, the number of nucleation sites may be increased. Due to the increased number of nucleation sites, the formation of the barrier metal layer 124 on the inner surface of the opening 116 can be facilitated and the barrier metal layer 124 may be continuously formed therein. As a result, the barrier metal layer 124 may be continuously formed on the inner surface and, in particular, the inner sidewall surface, of the opening 116 even when the opening has a high aspect ratio or a complex profile.

Figure 1D:
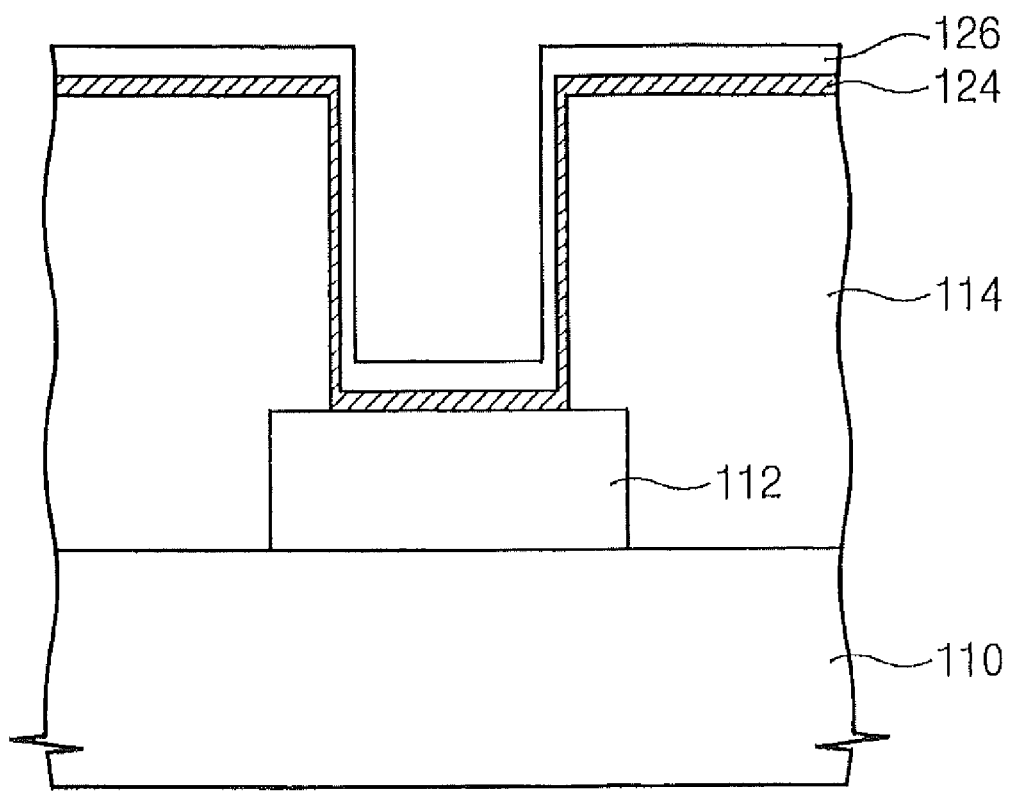

Referring to FIG. 1D, a seed layer 126 may be formed on the barrier metal layer 124. The seed layer 126 may be continuously formed on the portion of the barrier metal layer 124 that is formed on the inner surface of the opening 116. The seed layer 126 may also be formed on the barrier metal layer 124 that is formed on the upper surface of the interlayer dielectric layer 114. The seed layer 126 may comprise, for example, copper and may be formed, for example, by CVD, ALD, or electroless plating. The seed layer 126 may be formed on the bottom surface of the opening 116 to have a thickness of, for example, approximately 10 nm and on the inner sidewall surface of the opening 116 to have the thickness of, for example, approximately 4 nm. As explained in the foregoing with reference to FIGS. 1B and 1C, after performing the plasma treatment 118 on the inner surface of the opening 116, the barrier metal layer 124 may be continuously formed on the inner surface of the opening 116. While forming the seed layer 126, the barrier metal layer 124 may function as an absorption region for the seed layer 126. As a result, the seed layer 126 may be continuously formed on the continuously formed barrier metal layer 124.

For example, the barrier metal layer 124 may be formed of manganese, and the seed layer 126 may be formed of copper. While forming the copper seed layer 126, manganese used for the barrier metal layer 124 may function as an absorption region for copper. As a result, by continuously forming manganese as the barrier metal layer 124, the copper seed layer 126 formed on manganese may also be continuously formed.

Figure 1E:
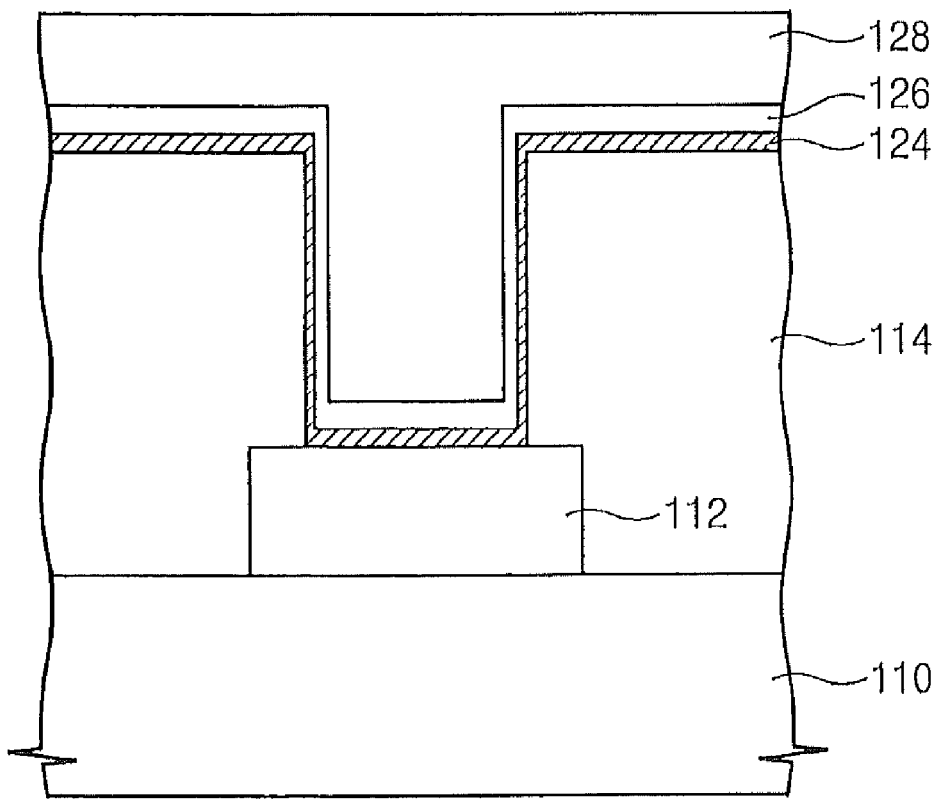

Referring to FIG. 1E, a metal bulk layer 128 may be formed on the seed layer 126. The metal bulk layer 128 may fill the remainder of the opening 116. The metal bulk layer 128 may comprise, for example, copper (Cu), and may be formed, for example, by CVD, ALD, electro-plating, or electroless plating. As explained in the foregoing with reference to FIG. 1D, the barrier metal layer 124 may function as an absorption region for the seed layer 126 and, therefore, the seed layer 126 may be continuously formed on the barrier metal layer 124. Because the seed layer 126 may be continuously formed, the metal bulk layer 128 may stably fill up the inner surface of the opening 116 so as to reduce and/or minimize voids and other defects. The metal bulk layer 128 may also be formed on the portion of the seed layer 126 that is formed on the upper surface of the interlayer dielectric layer 114.

Figure 1F:
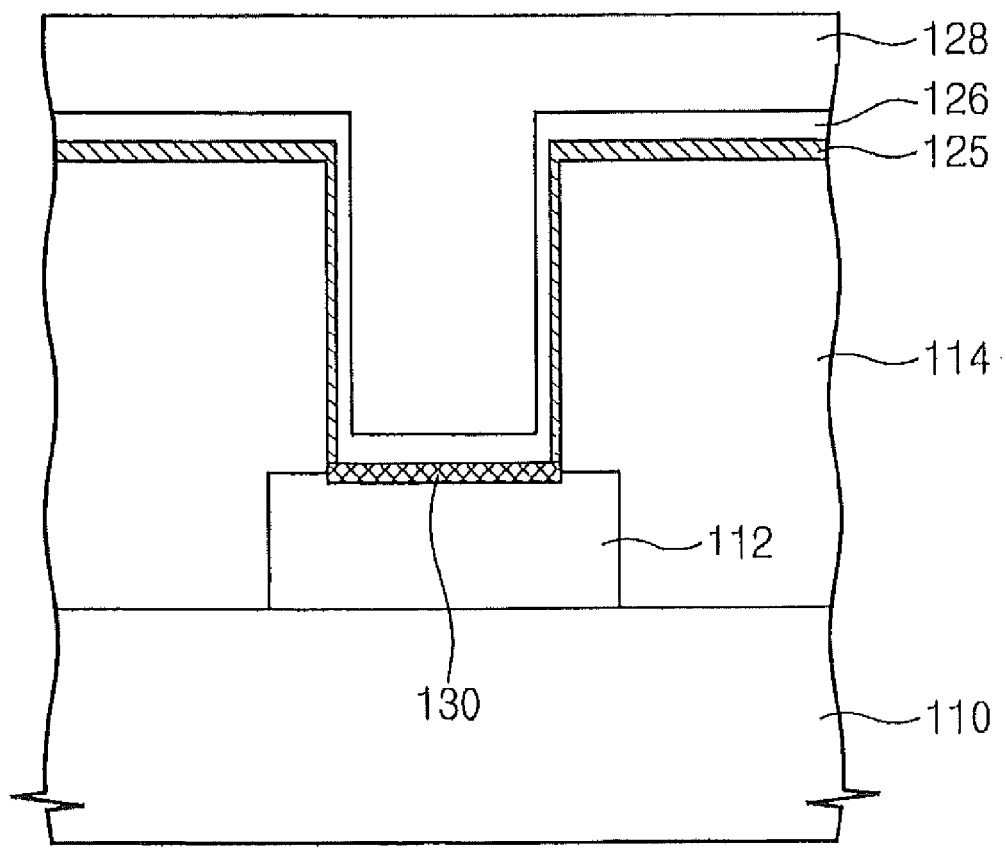

Referring to FIG. 1F, after forming the metal bulk layer 128, the resultant structure may be heat-treated. During to the heat treatment, the barrier metal layer 124 and the interlayer dielectric layer 114 can react with each other. Accordingly, a diffusion barrier layer 125 may be formed along an interface between the interlayer dielectric layer 114 and the seed layer 126. The diffusion barrier layer 125 may comprise a metallic oxide, which is formed by the reaction between metal diffused from the barrier metal layer 124 and oxygen diffused from the interlayer dielectric layer 114. The diffusion barrier layer 125 may reduce or prevent metal residing in the seed layer 126 and the metal bulk layer 128 from diffusing into the interlayer dielectric layer 114, and may similarly reduce or prevent materials residing in the interlayer dielectric layer 114 from diffusing into the seed layer 126 and the metal bulk layer 128. As explained in the foregoing with reference to FIG. 1C, because the barrier metal layer 124 may be continuously formed by the plasma treatment 118, the diffusion barrier layer 125 formed by the heat treatment may also be continuously formed. Due to the continuous formation of the diffusion barrier layer 125 at the interface between the seed layer 126 and the interlayer dielectric layer 114, an inter-diffusion of metal in layers 126/128 and materials residing in the interlayer dielectric layer 114 can be reduced, minimized and/or prevented.

For example, in some embodiments, the barrier metal layer 124 may be a manganese layer, the seed layer 126 and the metal bulk layer 128 may be copper layers, and the interlayer dielectric layer 114 may be a silicon oxide layer. During the heat treatment, manganese residing in the barrier metal layer 124 reacts with oxygen residing in the interlayer dielectric layer 114, thereby forming manganese oxide at the interface between the interlayer dielectric layer 114 and the copper seed layer 126. The manganese oxide that is formed by the heat treatment may be the diffusion barrier layer 125, which prevents copper in the seed layer 126 and the metal bulk layer 128 from diffusing into the interlayer dielectric layer 114 or materials residing in the interlayer dielectric layer 114 from diffusing into the seed layer 126 and the metal bulk layer 128. Because manganese can be continuously formed by the plasma treatment 118, manganese oxide may also be continuously formed. As a result, the inter-diffusion at the interface between the interlayer dielectric layer 114 and the copper seed layer 126 can be reduced, minimized and/or prevented.

The heat treatment may also reduce the resistivity of the seed layer 126 and/or the metal bulk layer 128. While forming the seed layer 126 and/or the metal bulk layer 128, metal atoms in the barrier metal layer 124 may diffuse into the seed layer 126 and/or the metal bulk layer 128. These diffused metal atoms may increase the resistivity of the seed layer 126 and/or the metal bulk layer 128. By performing the heat treatment, however, metal atoms from the barrier metal layer 124 that reside in the seed layer 126 and/or in the metal bulk layer 128 may move to the interface between the seed layer 126 and the barrier metal layer 124. As a result, the increase of resistivity of the seed layer 126 and/or the metal bulk layer 128 can be reduced or prevented. The heat treatment may also control the thickness of the diffusion barrier layer 125. The higher the temperature of the heat treatment, the more metal atoms of the barrier metal layer 124 that reside in the seed layer 126 and/or the metal bulk layer 128 may move to the interface. The metal atoms of the barrier metal layer 124 that move to the interface between the seed layer 126 and the barrier metal layer 124 may form the diffusion barrier layer 125 through a reaction with oxygen in the interlayer dielectric layer 114. As a result, the thickness of the diffusion barrier layer 125 may increase. The heat treatment may be carried out at a temperature of, for example, 100~500° C.

For example, as noted above, in some embodiments, the barrier metal layer 124 may be a manganese layer and the seed layer 126 and the metal bulk layer 128 may both comprise copper layers. While forming the copper seed layer 126 and the copper bulk layer 128, some of manganese atoms in the manganese barrier metal layer 124 may diffuse into the copper seed layer 126 and the copper bulk layer 128. By the heat treatment process, these manganese atoms may move from the copper seed layer 126 and/or the copper bulk layer 128 to the interface between the copper seed layer 126 and the manganese barrier metal layer 124. As a result, an increase in the resistivity of the copper seed layer 126 and/or the copper bulk layer 128 that might otherwise occur due to the presence of manganese atoms can be reduced or prevented. In particular, if the heat treatment is carried out at a temperature of 350° C. or higher, the resistivity of the copper seed layer 126 and/or the resistivity of the copper bulk layer 128 may be controlled to 3 μΩ/cm or less. In addition, the heat treatment may also control the thickness of manganese oxide, which functions as the diffusion barrier layer 125. The higher the temperature of the heat treatment, the greater the percentage of manganese atoms that reside in the copper seed layer 126 and/or the copper bulk layer 128 may move to the interface between the copper seed layer 126 and the manganese barrier metal layer 124. These manganese atoms may form a manganese oxide layer 125 at the interface between the copper seed layer and the interlayer dielectric layer 114. As a result, the thickness of the manganese oxide may increase with increasing heat treatment temperature.

A portion of the barrier metal layer 124 may remain on the diffusion barrier layer 125. In such a case, the remaining barrier metal layer 124, together with the diffusion barrier layer 125, may perform a function to reduce or prevent the inter-diffusion between the metal layers 126/128 and the interlayer dielectric layer 114.

Because the diffusion barrier layer 125 may be formed by the reaction between the atoms of the interlayer dielectric layer 114 and the barrier metal layer 124, the volume occupancy of the diffusion barrier layer 125 within the opening 116 may be decreased while the diffusion barrier layer 125 may be formed relatively thick. For example, while carrying out the heat treatment, the diffusion barrier layer 125 may grow in two directions. The first of these direction extends from the interface between the interlayer dielectric layer 114 and the barrier metal layer 124 into the interlayer dielectric layer 114. The second of these directions extends from the same interface between the interlayer dielectric layer 114 and the barrier metal layer 124 into the barrier metal layer 124. As a result, a relatively thick diffusion barrier layer 125 may be formed without decreasing the portion of the opening 116 that is occupied by the diffusion barrier layer 125.

During the heat treatment, the barrier metal layer 124 and the underlying conductive pattern 112 may also react with each other. In particular, during the heat treatment, metal atoms residing in the barrier metal layer 124 may react with materials residing in the underlying conductive layer 112, thereby forming a metal compound layer 130 at the interface between the underlying conductive pattern 112 and the seed layer 126. For example, the barrier metal layer 126 may be a manganese layer and the underlying conductive pattern 112 may be an arbitrary element A. In such an exemplary case, a metal compound $Mn_xA_y$ may be formed.

Meanwhile, at least a portion of the diffusion barrier layer 125 may be formed during the forming of the barrier metal layer 124. For example, where the process temperature for forming the barrier metal layer 124 is sufficiently high, the barrier metal layer 124 and at least a portion of the diffusion barrier layer 125 may be formed in-situ. As a result, the processing time for the heat treatment can be reduced.

Figure 1G:
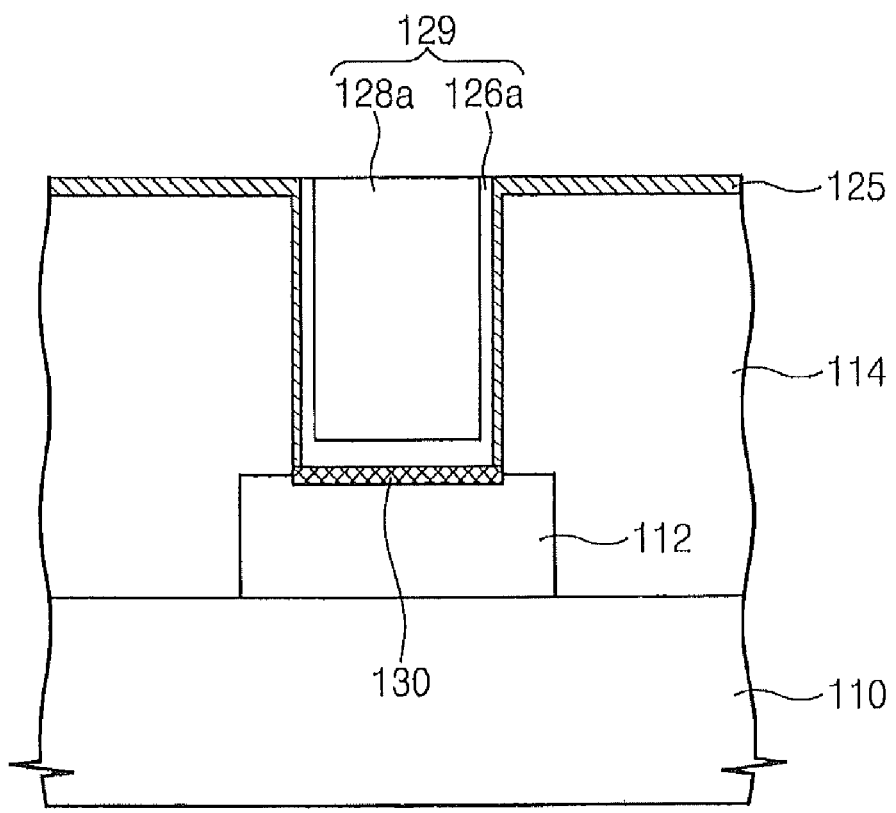

Referring to FIG. 1G, while forming the barrier metal layer 124, the seed layer 126 and the metal bulk layer 128 on the upper surface of the interlayer dielectric layer 114, a metal pattern 129 may be formed within the opening 116 by removing the seed layer 126 and the metal bulk layer 128 outside of the opening 116. The metal pattern 129 may comprise a seed pattern 126a and a metal bulk pattern 128a, which are sequentially stacked. The portions of the seed layer 126 and the metal bulk layer 128 that are outside of the opening 116 may be removed by planarizing until the diffusion barrier layer 125 on the upper surface of the interlayer dielectric layer 114 is exposed. Alternatively, the seed layer 126 and the metal bulk layer 128 outside of the opening 116 may be removed by a planarizing process that exposes an upper surface of the interlayer dielectric layer 114. Such planarization may be carried out, for example, by chemical mechanical polishing (CMP) or an etch back process.

According to the methods described above, due to the plasma treatment 118, the barrier metal layer 124 may be continuously formed on the inner surface of the opening 116. In addition, due to the continuously formed barrier metal layer 124, the seed layer 126 may be continuously formed on the barrier metal layer 124 in the opening 116. Therefore, the metal bulk layer 128 may be formed sufficiently to fill the opening 116. As a result, voids and other defects in the metal layers formed in the opening 116 can be reduced or minimized. In addition, due to the continuous diffusion barrier layer 125 and/or the continuous barrier metal layer 124, the inter-diffusion between the metal pattern 129 and the interlayer dielectric layer 114 can be reduced or minimized.

If the plasma treatment is not carried out, the barrier metal layer 124 may be discontinuously formed in the opening 116. In particular, the barrier metal layer 124 may not be formed fully on the lower portion of the inner sidewall surface of the opening 116. Due to such discontinuous formation of the barrier metal layer 124, voids may occur in the metal layer(s) that are deposited in the opening 116, or disconnection of the metal pattern, which can cause the failure of a semiconductor device. According to some embodiments of the present invention, by carrying out the plasma treatment 118, the continuous barrier metal layer 124, the continuous seed layer 126, and the continuous diffusion barrier layer 125 can be formed on the inner surface of the opening 116. As a result, the metal bulk layer 128 can sufficiently fill the opening 116, and inter-diffusion between the metal pattern 129 and the interlayer dielectric layer 114 can be reduced or minimized.

Figure 3:
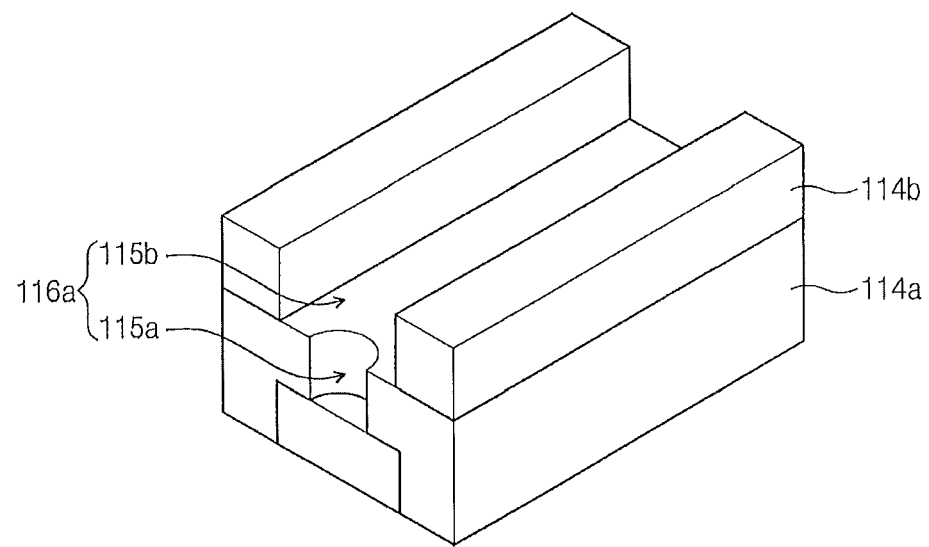

The opening 116 may have different shapes. For example, in some example embodiments the opening may comprise a cylindrical opening or may have a groove shape. This will be explained with reference to FIG. 3. FIG. 3 is a perspective sectional view, which illustrates a modified example of a opening.

Referring to FIG. 3, the opening 116a may be formed in the first and the second interlayer dielectric layers 114a, 114b, which are sequentially stacked. In particular, the opening 116a may comprise a contact hole 115a, which penetrates the first interlayer dielectric layer 114a, and a groove 115b formed in the second interlayer dielectric layer 114b. The groove 115b may be disposed on the contact hole 115a and may extend in a direction parallel to an upper surface of an underlying conductive layer. The groove 115b and the contact hole 115a may be connected to each other.

Figure 4:
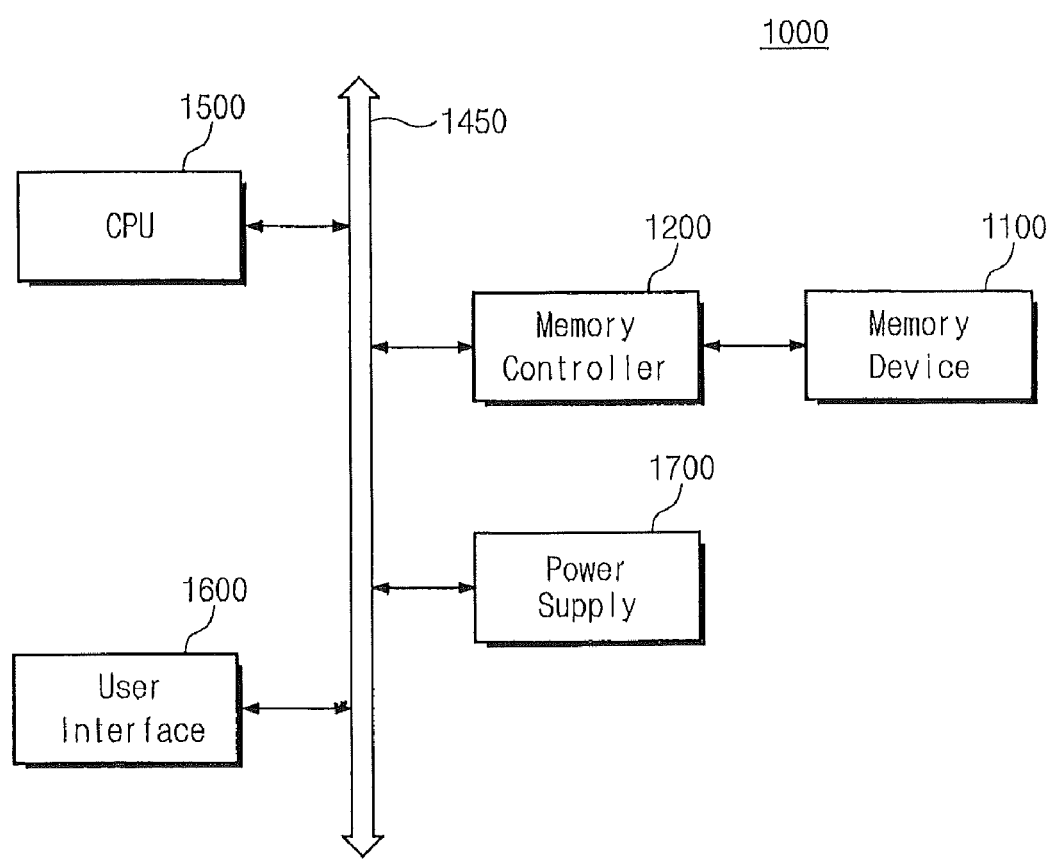

FIG. 4 shows a block diagram of a memory system employing a semiconductor device formed according to example embodiments of the present invention.

Referring to FIG. 4, the memory system 1000 according to exemplary embodiments of the present invention comprises a memory device 1100, a memory controller 1200, a central processing unit 1500 that is electrically connected to a system bus 1450, a user interface 1600, and a power supply 1700.

The data provided through the user interface 1600 or processed by the central processing unit 1500 may be stored in the memory device 1100 by way of the memory controller 1200. The memory device 1100 and the memory controller 1200 may constitute a Solid-State Drive/Disk (SSD). In such a case, writing speed of the memory system 1000 will be remarkably improved. Embodiments of the present invention may be applied to the memory device 1100, the memory controller 1200, and the central processing unit 1500.

Although not illustrated here, those skilled in the art will readily appreciate that the memory system 1000 according to exemplary embodiments of the present inventive concept may further comprise an application chipset, a camera image processor, and/or a mobile DRAM.

Further, the memory system 1000 according to exemplary embodiments of the present invention may be applicable to PDA, portable computer, web tablet, wireless phone, mobile handset, digital music player, memory card, or any device that is capable of sending and/or receiving information wirelessly. Many modifications are possible in the example embodiments without materially departing from the novel teachings and advantages of the present invention.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

That which is claimed is:

1. A method of forming a semiconductor device, comprising:
   forming a dielectric layer on a semiconductor material;
   forming an opening in the dielectric layer, the opening having a sidewall;
   plasma-treating the sidewall with at least one selected from a group of hydrogen, nitrogen, hydrogen and nitrogen, inert gas, and water vapor;
   forming a barrier metal layer on the sidewall of the opening after plasma-treating the sidewall;
   forming a metal layer in the opening; and
   heat treating the semiconductor device subsequent to formation of the barrier metal layer in order to react the barrier metal layer with the dielectric layer to form a metallic oxide diffusion barrier layer between the metal layer and the dielectric layer.

2. The method of claim 1, wherein an inner surface of the opening has a concave-convex profile following the plasma treatment.

3. The method of claim 1, wherein the plasma treatment uses at least one selected from a group of an inert gas and water vapor.

4. The method of claim 1, wherein the barrier metal layer includes manganese.

5. The method of claim 1, wherein the metallic oxide diffusion barrier layer grows in a first direction from the interface of the dielectric layer and the barrier metal layer into the dielectric layer and grows in a second direction from the interface of the dielectric layer and the barrier metal layer into the barrier metal layer.

* * * * *